United States Patent
Lin et al.

[11] Patent Number: 6,117,740
[45] Date of Patent: Sep. 12, 2000

[54] METHOD OF FORMING A SHALLOW TRENCH ISOLATION BY USING PE-OXIDE AND PE-NITRIDE MULTI-LAYER

[75] Inventors: Wei-Ray Lin, Yi Lan; Li-Yeat Chen, Hsinchu, both of Taiwan

[73] Assignee: Vanguard International Semiconductor Corporation, Hsinchu, Taiwan

[21] Appl. No.: 09/056,553

[22] Filed: Apr. 7, 1998

[51] Int. Cl.[7] .......................... H01L 21/336; H01L 21/76
[52] U.S. Cl. .......................... 438/296; 438/427; 438/435
[58] Field of Search ................................. 438/296, 427, 438/435

[56] References Cited

U.S. PATENT DOCUMENTS 5,387,539  2/1995  Yang et al. .
5,728,621  3/1998  Zheng et al. .
5,872,045  2/1999  Lou et al. .

Primary Examiner—Jey Tsai
Assistant Examiner—Josetta Jones
Attorney, Agent, or Firm—Christensen O'Connor Johnson & Kindness PLLC

[57] ABSTRACT

A thin silicon dioxide layer is formed on the substrate to act as a pad layer. Subsequently, a silicon nitride layer is deposited on the pad layer. Trenches are formed in the substrate. The trenches include first trenches and a second trench that has a relatively wide opening compared to the first trenches. An CVD-oxide layer is formed on the silicon nitride layer and refilled into the trenches. A multi-layer is then formed on the CVD-oxide layer. The multi-layer includes alternating PE-nitride layers and PE-oxide layers. Subsequently, a chemical mechanical polishing (CMP) technology is used for removing the multi-layer layer to the surface of the silicon nitride layer.

12 Claims, 2 Drawing Sheets

METHOD OF FORMING A SHALLOW TRENCH ISOLATION BY USING PE-OXIDE AND PE-NITRIDE MULTI-LAYER

FIELD OF THE INVENTION

The present invention relates to a method of forming isolation for integrated circuits, and more specifically, to a method of forming a shallow trench isolation using a multi-layer with chemical mechanical polishing.

BACKGROUND OF THE INVENTION

Semiconductor integrated circuits (ICs) have evolved towards increased density and device shrinkage. One important structure in the manufacture of ICs is isolation structures. Devices formed in the silicon substrate must be isolated from one another. Establishing effective isolation in submicron ICs in the face of decreased isolation space is a complicated and challenging task. In ULSI, a tiny amount of leakage per device due to improper isolation can induce significant power dissipation for the entire circuit.

A common way for isolation is the use of LOCOS (LOcal Oxidation of Silicon) isolation. LOCOS involves the formation of Field Oxides (FOX) in the nonactive regions of the substrate. As device geometry reaches submicron size however, conventional LOCOS isolation has its limitations. For example, the "bird's beak" structure of LOCOS causes unacceptably large encroachment of the field oxide into the device active regions. Further, the planarity (or lack thereof) of the surface topography after LOCOS is inadequate for submicron lithography needs. Therefore, trench isolation is one of the newer approaches adopted for use in isolation.

Trench isolation is used primarily for isolating devices in VLSI and ULSI, and hence they can be considered as replacement for conventional LOCOS isolation. Further, shallow trench isolation is gaining popularity for 0.25 micron technology. Within the dielectric isolation area, dielectric is refilled into a trench. In the basic shallow trench isolation (STI) technology, shallow trenches are anisotropically etched into the silicon substrate. Next, a CVD oxide is deposited onto the substrate and is then planarized by CMP (Chemical Mechanical Polishing) or etching back. Unfortunately, the planarization of shallow trench isolation relies on chemical mechanical polishing (CMP) which has been proven an effective but challenging process.

The aforementioned challenges associated with CMP for STI include the "dishing effect" for wide trenches. The dishing effect degrades the planarity of a layer, and it also impacts the control of implantation. Some prior art attempts to solve the problem use reverse tone structure. This method involves forming protruded portions to eliminate the dishing effect. However, the conventional method needs a photo-masking step, an etching process and a step to remove the photomasking.

What is needed is a more efficient method for forming high quality shallow trench isolation structures.

SUMMARY OF THE INVENTION

A method of forming a shallow trench isolation on a substrate is disclosed. The method comprises the steps of: forming a pad layer on said substrate; forming a silicon nitride layer on said pad layer; forming at least one first trench and a second trench in the substrate, wherein said second trench has a wider opening than said at least one first trench; forming an CVD-oxide layer for isolation atop said silicon nitride layer and said at least first trench and said second trench; forming a multi-layer on said CVD-oxide layer, wherein said multi-layer includes alternating PE-nitride layers and PE-oxide layers; performing a CMP on said multi-layer, said CMP stopping at a surface of said silicon nitride layer; and removing said silicon nitride layer and said pad layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclosed to form shallow trench isolation (STI) by using a multi-layer and chemical mechanical polishing (CMP). The present invention will solve the dishing effect. The multi-layer preferably includes a PE-oxide and a PE-nitride. Further, the multi-layer acts as a sacrificial layer to planarize the whole wafer. As will be seen below, this technique can be used for planarization of shallow trench isolations.

Figure 1:
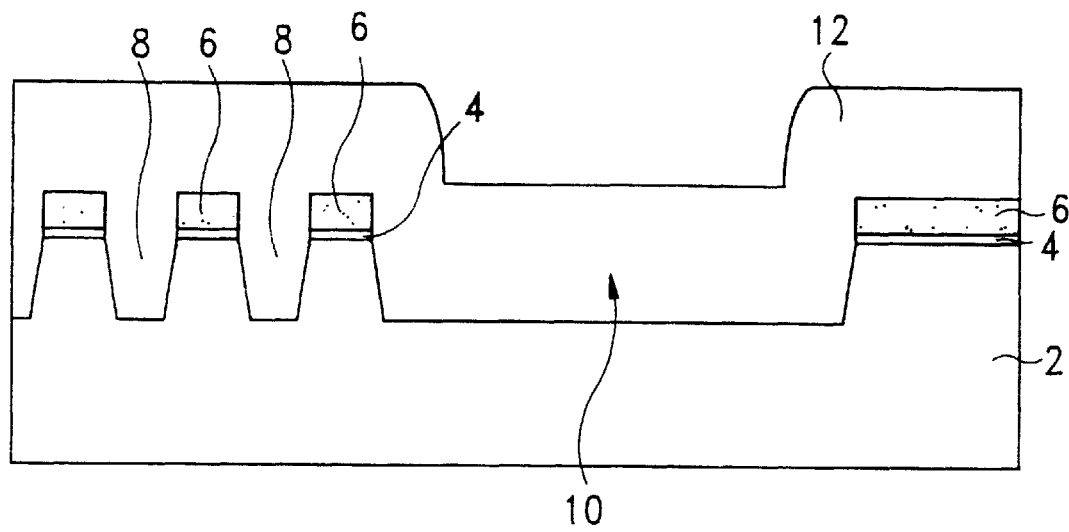
FIG. 1 is a cross section view of a semiconductor wafer illustrating the step of forming an oxide layer into trenches formed on a substrate in accordance with the present invention.

Referring to FIG. 1, in the preferred embodiment, a silicon substrate 2 can be p-type or n-type silicon with <100> crystallographic orientation. A thin silicon dioxide layer 4 is formed on the substrate 2 to act as a pad layer. The silicon dioxide 4 is typically formed by using a thermal oxidation in oxygen ambient. In one embodiment, the silicon dioxide layer 4 is formed by using an oxygen-steam ambient, at a temperature of about 800–1100° C. Alternatively, the oxide layer 4 may be formed using any suitable oxide chemical compositions and procedures. In this embodiment, the thickness of the silicon dioxide layer is approximately 50–500 angstroms.

Subsequently, a silicon nitride layer 6 is deposited on the pad layer 4 to serve as a stop layer for subsequent CMP. Any suitable conventional process can be used to deposit the silicon nitride layer 6. For example, low pressure chemical vapor deposition (LPCVD), plasma enhance chemical vapor deposition (PECVD), or high density plasma chemical vapor deposition (HDPCVD) may be used. The thickness of the silicon nitride layer is about 500 to 2000 angstroms. Further, the temperature used to form the silicon nitride layer 6 is preferably in the range of 400–800° C. Preferably, the temperature for the CVD is about 400–500° C., and the temperature is about 500–800° C. for LPCVD. In the preferred embodiment, the reaction gases of the step to form silicon nitride layer 6 are $SiH_4$, $NH_3$, $N_2$, $N_2O$, $SiH_2Cl_2$, $NH_3$, $N_2$, and $N_2O$.

Still referring to FIG. 1, a photoresist is patterned on the silicon nitride layer 6 to define the isolation region. A plurality of shallow trenches are subsequently generated by using a dry etching technique. The trenches include at least one first trench 8 and a second trench 10 that has a wide opening relative to the first trenches 8. The silicon nitride layer 6, the pad layer 4 and the substrate 2 can respectively be etched away using conventional means. Typically, the depth of the shallow trench is about 3000 to 10000 angstroms from the surface of the silicon nitride layer 6. The photoresist is then stripped away.

Next, an oxide layer 12 is formed by CVD on the silicon nitride layer 6 and refilled into the trenches 8 and 10. The oxide 12 formed by CVD is referred to as CVD-oxide. The thickness of the CVD-oxide layer 12 is about 500 to 2000 angstroms. Wherein the CVD-oxide layer 12 can be formed by selecting from a group consisting of LPCVD, APCVD, SACVD and HDPCVD technique.

Figure 2:
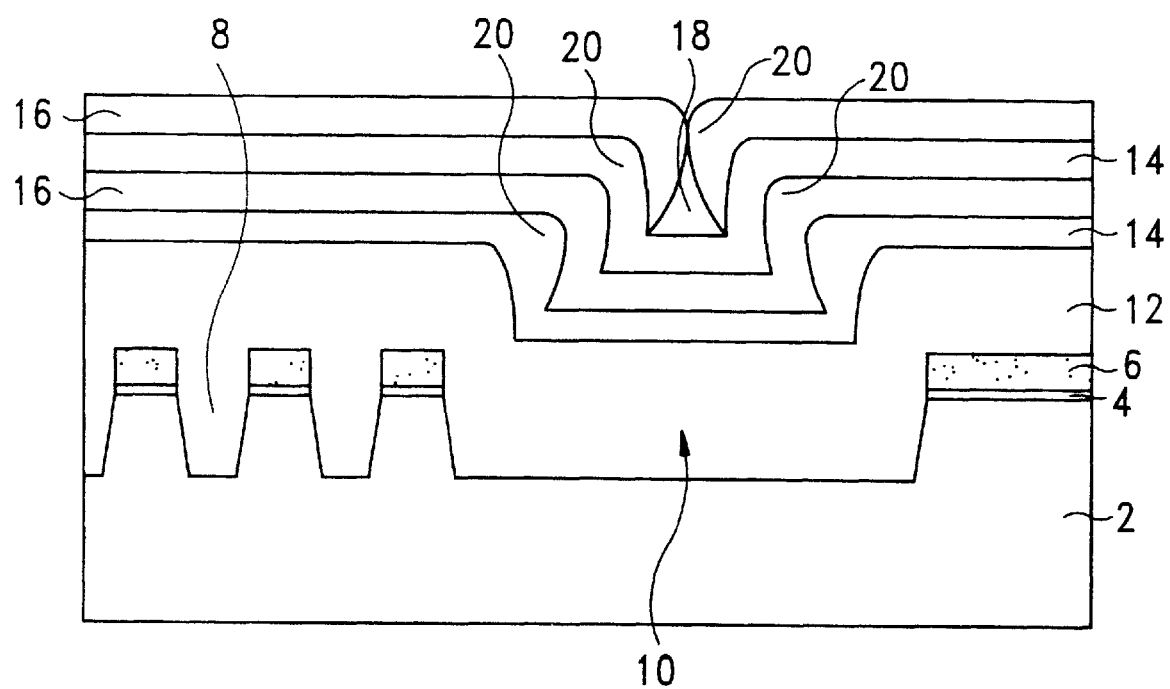
FIG. 2 is a cross section view of a semiconductor wafer illustrating the step of forming a multi-layer on the oxide in accordance with the present invention.

Turning next to FIG. 2, a multi-layer is then formed on the CVD-oxide layer 12. The multi-layer includes alternating PE-nitride layers 14 and PE-oxide layers 16. In the present invention, the silicon oxide and silicon nitride that is formed by plasma enhance CVD are referred to PE-oxide and PE-nitride, respectively. Further the PE-nitride layer 14 exhibits a lower polishing rate than that of the PE-oxide layer 16 under a CMP process. In the preferred embodiment, the multi-layer includes at least two of the PE-oxide layers 16 and two of the PE-nitride layers 14. The firstly formed layer of the multi-layer is a PE-nitride layer 14, which is referred to herein as an odd layer. Therefore, the odd layers of the multi-layer are formed of PE-nitride layers 14, whereas the even layers of the multi-layer are formed of PE-oxide layers 16.

A pin hole 18 will be generated in the multi-layer and over the second trench 10 due to the poor step coverage. Each layer of the multi-layer structure has overhang portions 20 at the edge of the layers.

Figure 3:
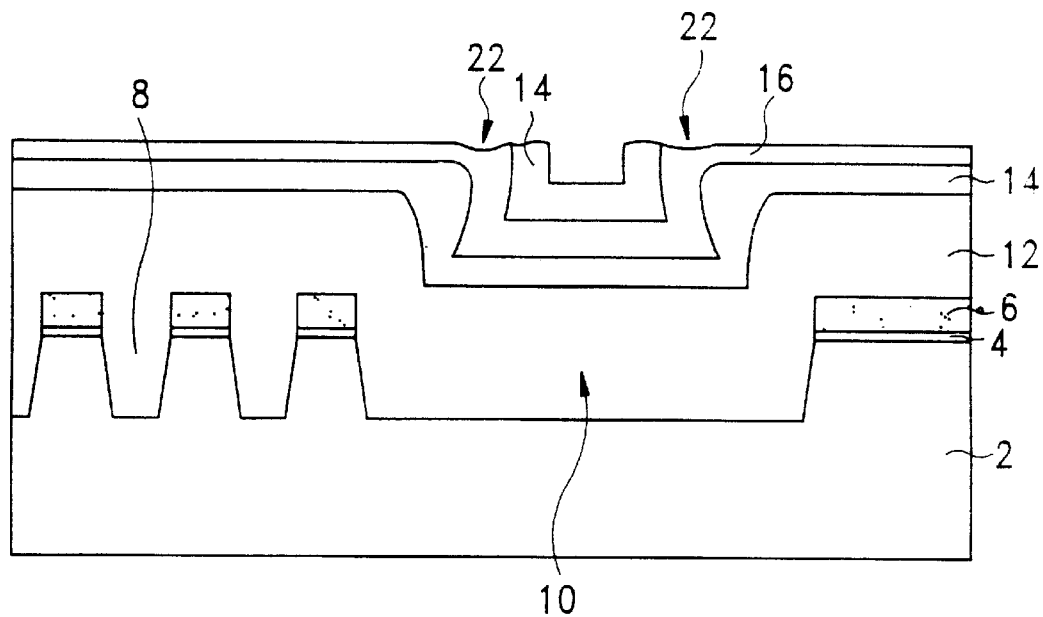
FIG. 3 is a cross section view of a semiconductor wafer illustrating the step of performing a CMP on the multi-layer in accordance with the present invention.

Referring to FIG. 3, subsequently, a chemical mechanical polishing (CMP) technology is used to remove one or more of the layers in the multi-layer. As shown in FIG. 3, the CMP planarization will polish PE-oxide layer 16, PE-nitride layer 14 to expose the pin hole 18. When the CMP process reaches the pin hole 18, the different polishing rate between the PE-oxide layer 16 and the PE-nitride layer 14 will speed up the removal of the PE-oxide 16. Thus, recessed portions 22 are generated on the surface of the PE-oxide 16. The area over the second trenches 10 has a lower polishing rate than other areas. In the prior art, the primary reason for the dishing effect is that the area over the wider trench has a faster polishing rate due to the characteristics of CMP. Therefore, the present invention will prevent the dishing effect by using a multi-layer structure. The multi-layer is used as a sacrificial layer for the CMP process.

Figure 4:
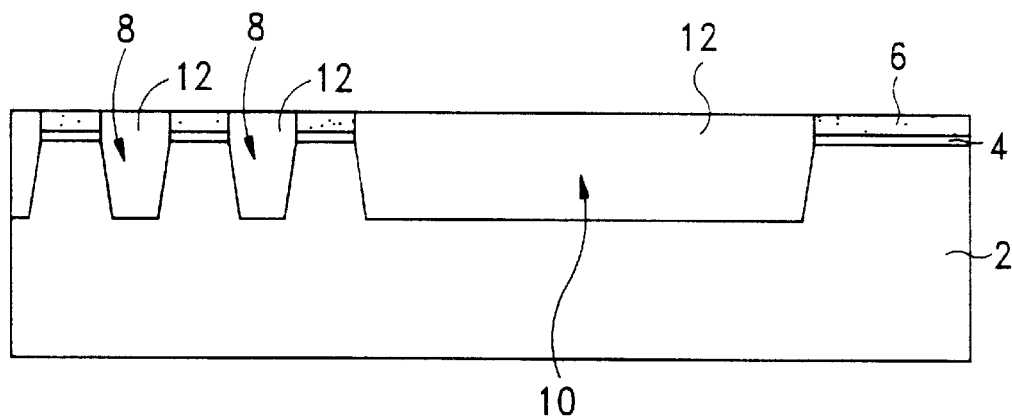
FIG. 4 is a cross section view of a semiconductor wafer following the CMP step in accordance with the present invention.
Figure 5:
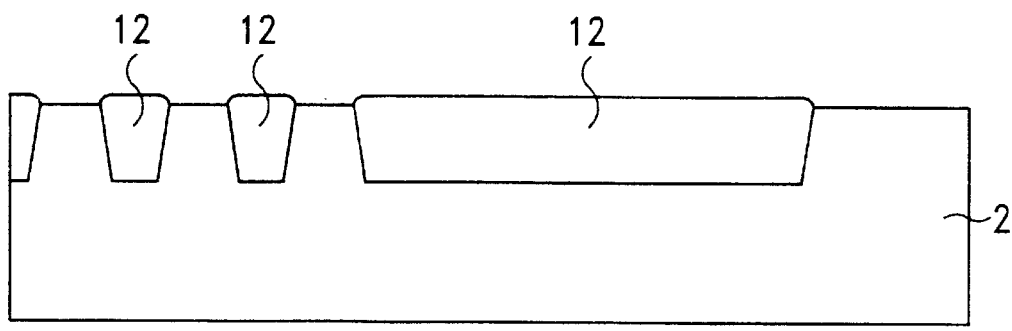
FIG. 5 is a cross section view of a semiconductor wafer illustrating the steps of removing a silicon nitride layer and a pad oxide layer in accordance with the present invention.

The removal rate of the CVD-oxide 12 is faster than the multi-layer. Thus, the result after the CMP is shown in FIG. 4. The CMP is controlled to stop at the surface of the silicon nitride layer 6. The silicon nitride layer 6 is then removed by using a hot phosphorus acid solution. Subsequently, the pad oxide is removed by using diluted HF solution or BOE (buffer oxide etching) solution. The resulting structure is shown in FIG. 5. Therefore, there will be no dishing effect in the present invention.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a shallow trench isolation on a substrate, said method comprising:

forming a pad layer on said substrate;

forming a silicon nitride layer on said pad layer;

forming at least one first trench and a second trench in the substrate, wherein said second trench has a wider opening than said at least one first trench;

forming a CVD-oxide layer for isolation atop said silicon nitride layer and said at least first trench and said second trench;

forming a multi-layer on said CVD-oxide layer, wherein said multi-layer includes alternating PE-nitride layers and PE-oxide layers; and performing a CMP on said multi-layer, said CMP stopping at a surface of said silicon nitride layer.

2. The method of claim 1, further comprising the steps of after performing said CMP:

removing said silicon nitride layer; and removing said pad oxide layer.

3. The method of claim 1, wherein said step of forming said at least one first trench and said second trench includes:

patterning a photoresist on said silicon nitride layer to define a trench region;

etching said silicon nitride layer, said pad layer and said substrate by using said photoresist as a mask; and removing said photoresist.

4. The method of claim 1, wherein said pad oxide layer comprises silicon oxide.

5. The method of claim 1, wherein said CVD-oxide layer is formed by selecting from a group consisting of LPCVD, APCVD, SACVD and HDPCVD technique.

6. The method of claim 1, wherein said PE-oxide layer is formed by plasma enhanced technology.

7. The method of claim 1, wherein said PE-nitride layer is formed by plasma enhanced technology.

8. The method of claim 2, wherein said pad oxide layer is removed by diluted HF solution.

9. The method of claim 2, wherein said pad oxide layer is removed by BOE (buffer oxide etching) solution.

10. The method of claim 1, wherein said silicon nitride layer is removed by hot phosphorus acid solution.

11. The method of claim 1, wherein the gases of forming said silicon nitride layer are $SiH_4$, $NH_3$, $N_2$, $N_2O$.

12. The method of claim 1, wherein the gases of forming said silicon nitride layer are $SiH_2Cl_2$, $NH_3$, $N_2$, $N_2O$.

* * * * *